United States Patent
Liang

(10) Patent No.: US 8,534,775 B1
(45) Date of Patent: Sep. 17, 2013

(54) SERVER CABINET

(75) Inventor: An-Gang Liang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/472,513

(22) Filed: May 16, 2012

(30) Foreign Application Priority Data

Mar. 8, 2012 (CN) .......................... 2012 1 0059391

(51) Int. Cl.
*H05K 5/00* (2006.01)
(52) U.S. Cl.
USPC ..................... 312/223.1; 312/265.1; 312/333; 361/724
(58) Field of Classification Search
USPC .............. 312/223.1, 223.3, 265.1, 333, 348.1, 312/348.2, 330.1, 332.1; 211/26, 192; 361/679.01, 679.02, 724–727
See application file for complete search history.

(56) References Cited

U.S. PATENT DOCUMENTS

| | | | |
|---|---|---|---|
| 6,269,959 B1 * | 8/2001 | Haworth ......................... 211/26 |
| 6,926,378 B2 * | 8/2005 | Greenwald et al. ......... 312/334.4 |
| 7,780,253 B1 * | 8/2010 | Lu ................................ 312/334.4 |
| 8,248,811 B2 * | 8/2012 | Peng et al. ..................... 361/756 |
| 2003/0227752 A1 * | 12/2003 | Yair et al. ..................... 361/725 |
| 2005/0218091 A1 * | 10/2005 | Westphall ....................... 211/26 |
| 2005/0285492 A1 * | 12/2005 | Hu et al. .................... 312/334.4 |
| 2009/0101603 A1 * | 4/2009 | Hilburn et al. .................. 211/26 |
| 2011/0226710 A1 * | 9/2011 | Peng et al. ...................... 211/26 |

* cited by examiner

*Primary Examiner* — Daniel Rohrhoff
(74) *Attorney, Agent, or Firm* — Altis & Wispro Law Group, Inc.

(57) ABSTRACT

A server cabinet for receiving a server includes two sidewalls forming two rails to support the server. A fixing board perpendicularly extends from a rear side of each sidewall toward the other sidewall and longitudinally defines a number of through holes. Each fixing board includes a blocking member. The blocking member includes a main portion, two curved claws extending from top and bottom ends of the main portion to be engaged in two through holes of the fixing board, and an extension piece extending from a side of the main portion to block a rear side of the server.

7 Claims, 4 Drawing Sheets

SERVER CABINET

CROSS-REFERENCE TO RELATED APPLICATION

Relevant subject matter is disclosed in a pending U.S. patent application, titled "SERVER CABINET", filed on Apr. 1, 2012, with the application Ser. No. 13/436,982, which is assigned to the same assignee as this patent application.

BACKGROUND

1. Technical Field

The present disclosure relates to a server cabinet.

2. Description of Related Art

Most cabinets for receiving servers have no mounting structure for mounting rear sides of the servers. As a result, the servers may drop out of the cabinets during transport.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
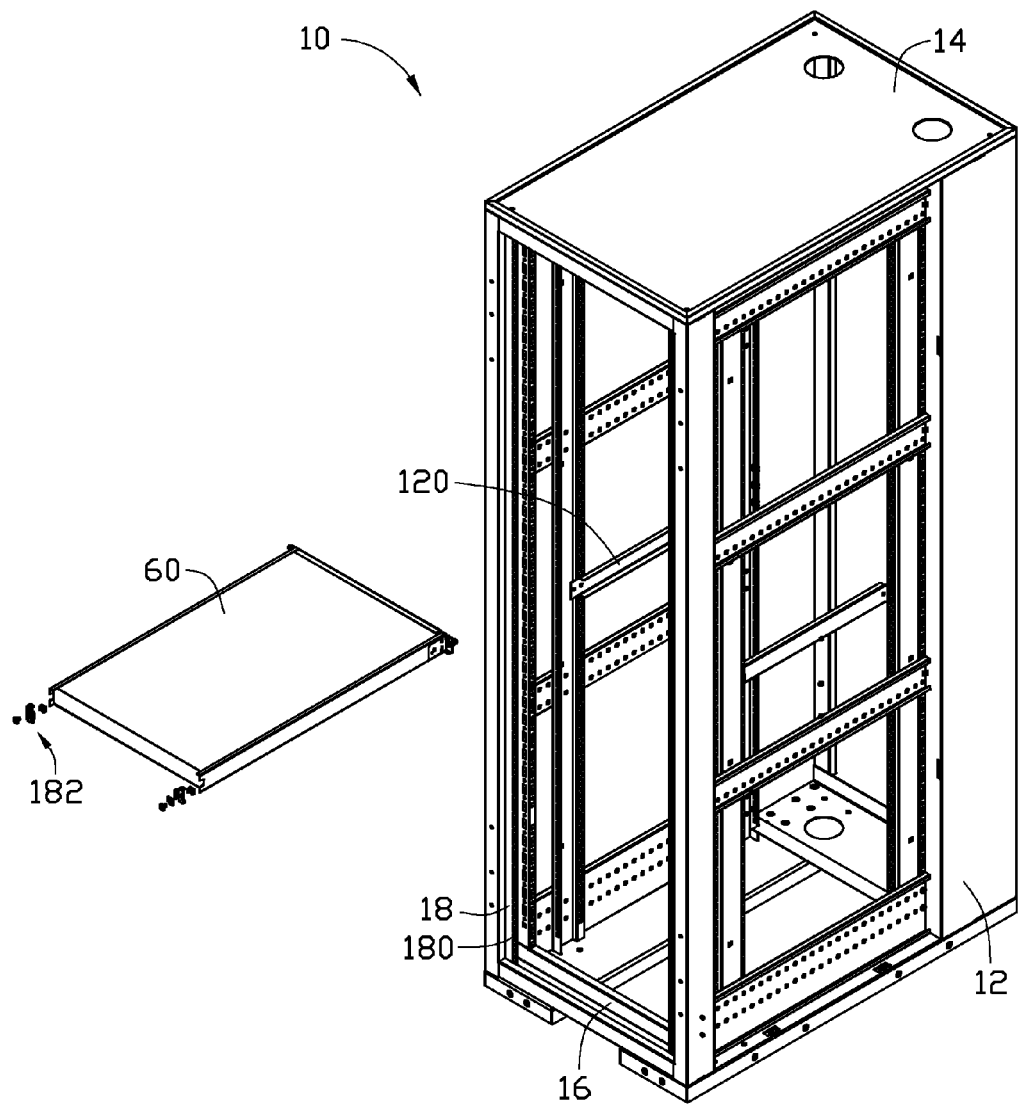
FIG. 1 is an exploded, isometric view of an exemplary embodiment of a cabinet together with a server.
Figure 2:
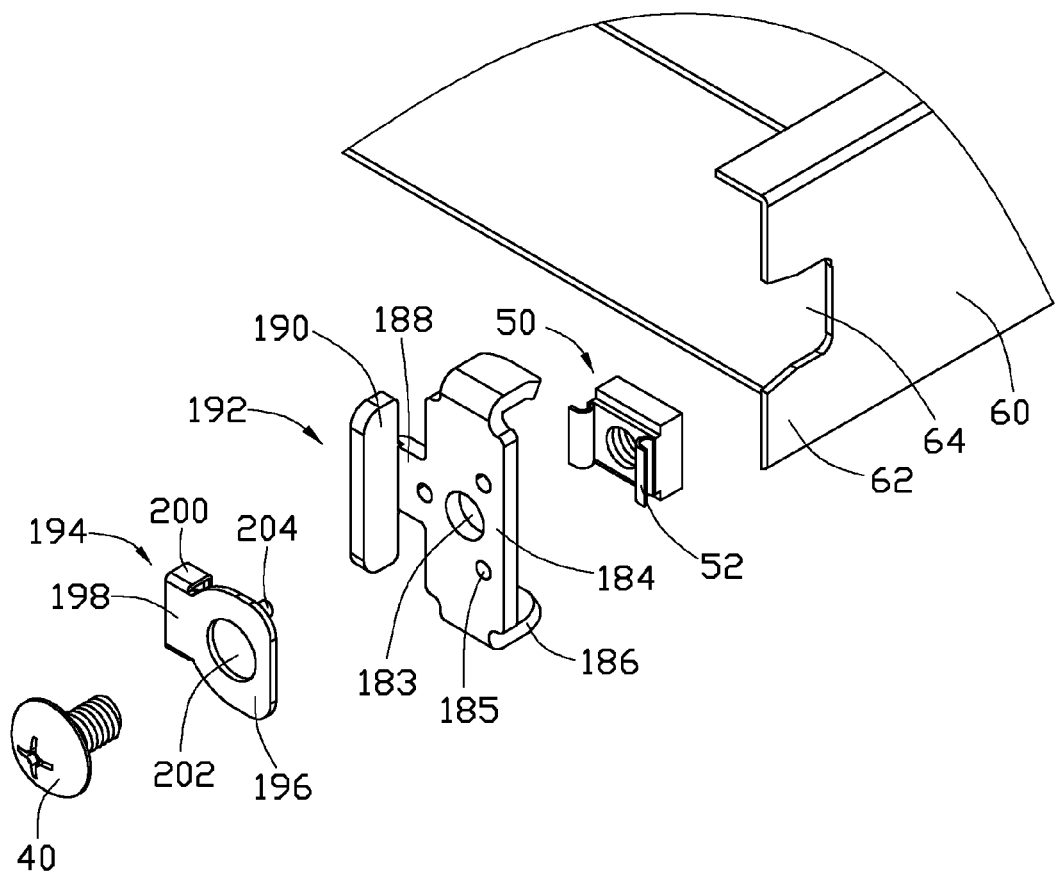
FIG. 2 is an enlarged view of a part of the cabinet and a part of the server of FIG. 1.

FIGS. 1 and 2 show an exemplary embodiment of a cabinet 10 for receiving a server 60. The server 60 forms two clamping portions 62 extending rearward from rear ends of opposite sides of the server 60. Each clamping portion 62 defines an opening 64.

The cabinet 10 includes two opposite sidewalls 12, a top wall 14 perpendicularly connected between top ends of the sidewalls 12, and a bottom wall 16 perpendicularly connected between bottom ends of the sidewalls 12. Each sidewall 12 forms a rail 120 parallel to the bottom wall 16.

A fixing board 18 perpendicularly extends from a rear side of each sidewall 12 toward the other sidewall 12, and longitudinally defines a plurality of through holes 180. A blocking member 182 is detachably mounted to a rear surface of each fixing board 18.

Each blocking member 182 includes a main body 192, a shock-proof member 194, a bolt 40, and a nut 50. The shock-proof member 194 may be made of rubber.

The main body 192 includes a main portion 184 defining a through hole 183, two curved claws 186 extending forward from top and bottom ends of the main portion 184, an extension piece 188 extending out from a side of the main portion 184, and a limiting piece 190 perpendicularly extending rearward from a distal end of the extension piece 188 opposite to the main portion 184. The main portion 184 defines three fixing holes 185 around the through hole 183.

The shock-proof member 194 includes a fixing piece 196, a connection piece 198 extending out from a side of the fixing piece 196, and two L-shaped arms 200 perpendicularly extending forward from top and bottom ends of the connection piece 198. Distal ends of the arms 200 extend toward each other. The fixing piece 196 defines a through hole 202 in a center. Three pins 204 extend from a front surface of the fixing piece 196, to be inserted into the fixing holes 185, thereby fixing the fixing piece 196 to a rear surface of the main portion 184. The arms 200 clamp the extension piece 188, and the distal ends of the arms 200 are engaged with a front side of the extension piece 188.

The nut 50 includes two curved claws 52 extending from opposite sides of a surface of the nut 50, away from each other.

Figure 3:
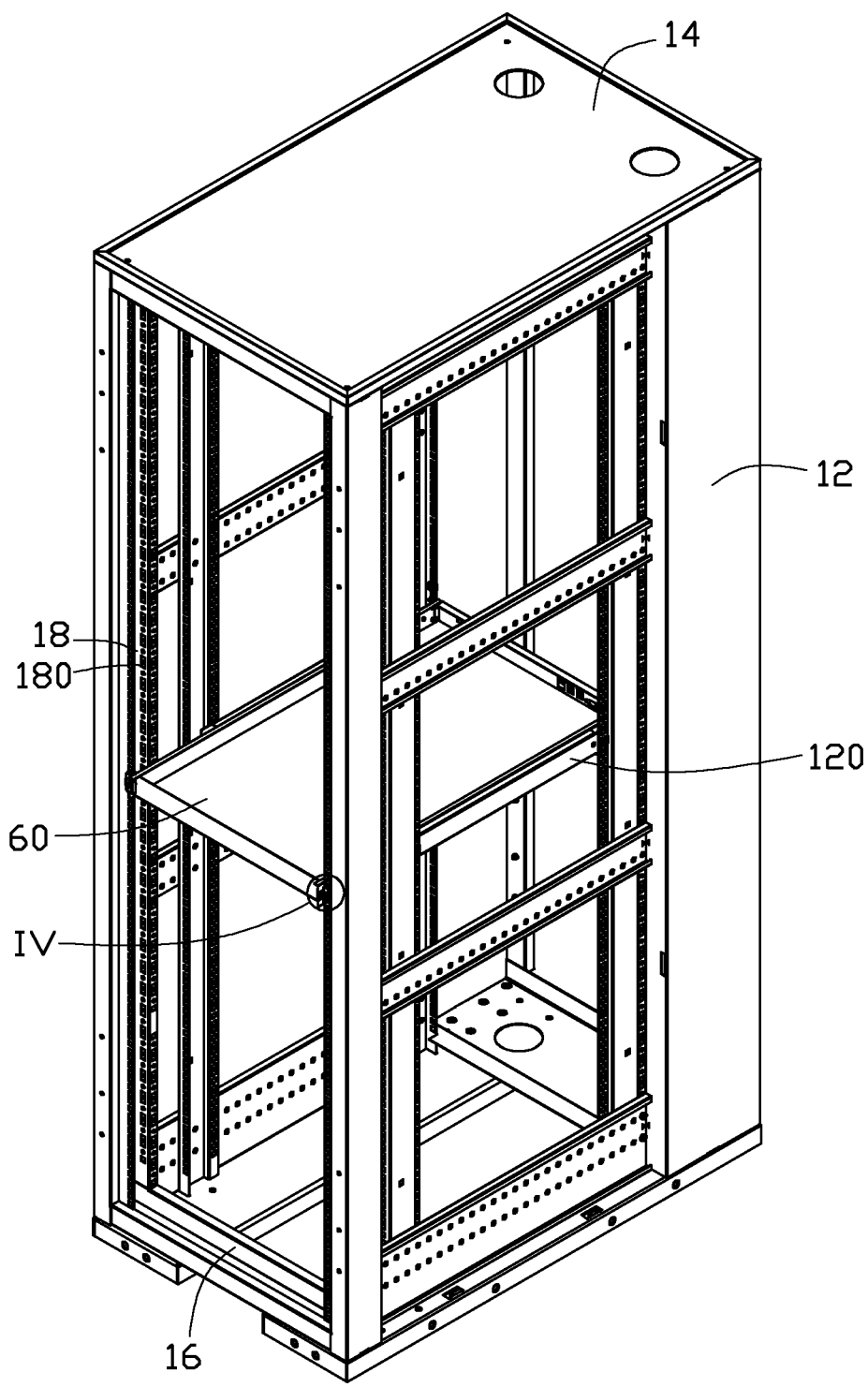
FIG. 3 is an assembled, isometric view of the cabinet and the server of FIG. 1.
Figure 4:
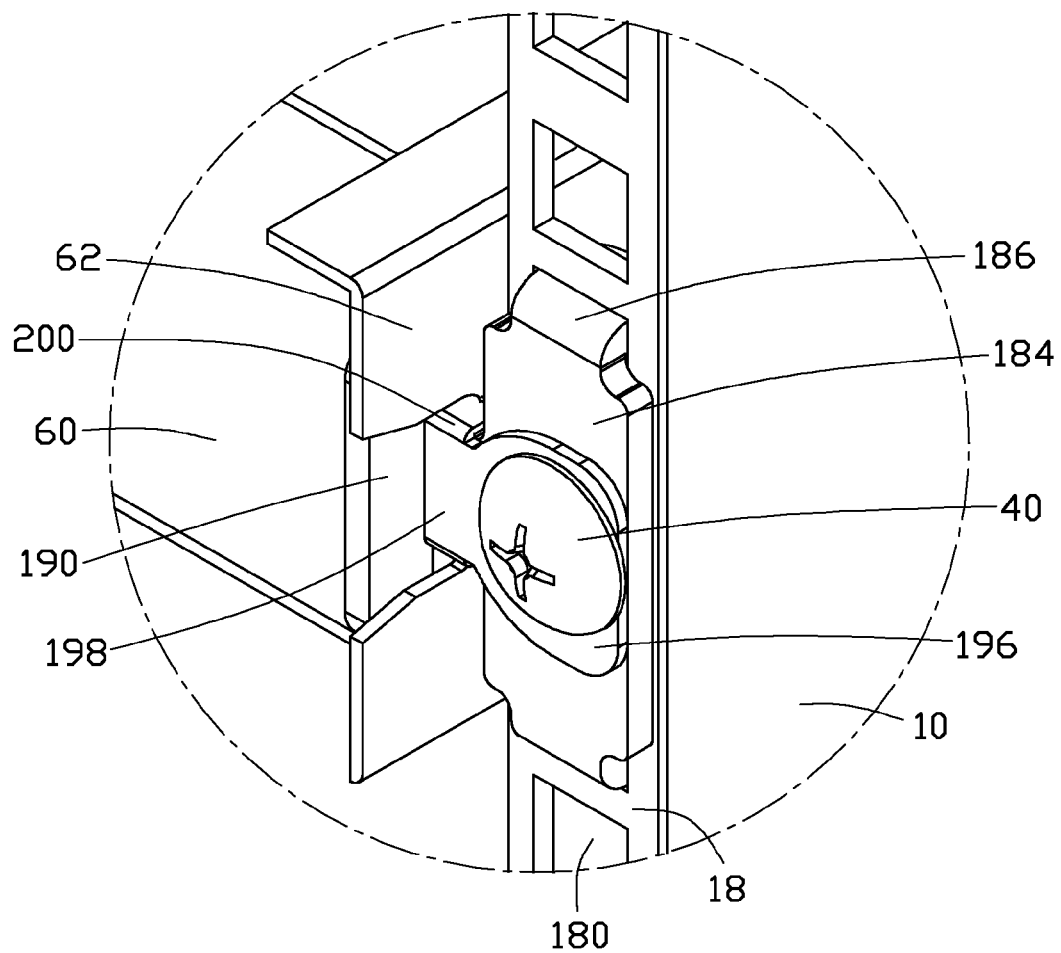
FIG. 4 is an enlarged view of the circled portion IV of FIG. 3.

Referring to FIGS. 3 and 4, in assembling each blocking member 182, the claws 52 are deformed toward each other, and then extended through one of the through holes 180. The claws 52 then rebound to engage with the rear side of the fixing board 18, thereby fixing the nut 50 at a front side of the fixing board 18. The claws 186 are engaged in two through holes 180 above and below the nut 50, to position the main body 192 on the rear side of the fixing board 18. The bolt 40 is extended through the through holes 202 and 183, and a corresponding one of the through holes 180, and then is screwed into the nut 50, to fix the blocking member 182 to the rear side of the fixing board 18.

In use, the server 60 is slid rearward into the cabinet 10 and supported by the rails 120, until the extension pieces 188 together with the corresponding shock-proof arms 200 are engaged in the corresponding openings 64. At this time, the clamping portions 62 are blocked by the corresponding limiting pieces 190. A front side of the server 60 is fixed to front sides of the sidewalls 12 with fasteners (not shown).

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A cabinet for receiving a server forming two clamping portions at a rear side, each clamping portion defining an opening, the cabinet comprising:

two opposite sidewalls forming two rails for supporting the server;

two fixing boards each perpendicularly extending from a rear side of one of the sidewalls toward the other sidewall, and each longitudinally defining a plurality of through holes; and two blocking members each attached to one of the fixing boards, to block a rear side of the server, each blocking member comprising a main body, the main body comprising a main portion, two curved first claws extending from top and bottom ends of the main portion to be engaged in two through holes of the corresponding fixing board, and an extension piece extending from a side of the main portion to be engaged in the opening of a corresponding one of the clamping portions of the server.

2. The cabinet of claim 1, wherein a limiting portion perpendicularly extends from a distal end of each extension piece to block the corresponding clamping portion of the server.

3. The cabinet of claim 1, wherein each blocking member further comprises a shock-proof member attached to the main body, the shock-proof member comprises a fixing piece attached to a side of the main portion, a connection piece extending out from a side of the fixing piece, and two arms extending from top and bottom ends of the connection piece to clamp the extension piece and engaged in the opening of the corresponding clamping portion together with the extension piece.

4. The cabinet of claim 3, wherein the arms are substantially L-shaped, distal ends of the arms are extended toward each other and blocked by a front side surface of the extension piece.

5. The cabinet of claim 3, wherein each blocking member further comprises a bolt and a nut, the bolt extends through the fixing piece, the main portion, a corresponding through hole, and then is screwed into the nut, to fix the blocking member to the rear side of the corresponding fixing board.

6. The cabinet of claim 5, wherein the nut comprises two curved second claws extending from opposite sides of the nut and away from each other, the second claws are extended through the corresponding through hole of the corresponding fixing board, between the first claws of the main body, and are blocked by the rear side of the corresponding fixing board, to position the nut at a front side of the fixing board.

7. The cabinet of claim 3, wherein the main portion defines a fixing hole, a pin extends from a side of the fixing piece to be engaged in the fixing hole, to fix the fixing piece to the main portion.

\* \* \* \* \*